United States Patent
Yao et al.

(10) Patent No.: US 9,281,967 B2
(45) Date of Patent: Mar. 8, 2016

(54) RAIL-TO-RAIL LINE DRIVER USING DIFFERENTIAL CASCODE BOOTSTRAPING

(71) Applicant: Broadcom Corporation, Irvine, CA (US)

(72) Inventors: Yuan Yao, Irvine, CA (US); Jing Wang, Riverside, CA (US); Junhua Tan, Tustin, CA (US); Mostafa Mohammad Hany Ali Hammad, Irvine, CA (US); Hui Pan, Trabuco Canyon, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/090,512

(22) Filed: Nov. 26, 2013

(65) Prior Publication Data
US 2015/0137887 A1 May 21, 2015

Related U.S. Application Data

(60) Provisional application No. 61/906,107, filed on Nov. 19, 2013.

(51) Int. Cl.
| | |
|---|---|
| *G11C 8/00* | (2006.01) |
| *H04L 25/02* | (2006.01) |
| *H03F 3/21* | (2006.01) |
| *H03F 3/45* | (2006.01) |

(52) U.S. Cl.
CPC ............ *H04L 25/0272* (2013.01); *H03F 3/211* (2013.01); *H03F 3/45179* (2013.01); *H03F 2200/456* (2013.01); *H03F 2203/45311* (2013.01); *H03F 2203/45356* (2013.01); *H03F 2203/45394* (2013.01); *H03F 2203/45481* (2013.01)

(58) Field of Classification Search
CPC .................. H03K 19/00361; H03K 19/00315; H03K 17/063; H04L 25/0278; H04L 25/0269
USPC ......... 327/108–112, 379, 389, 390, 545, 546, 327/589
See application file for complete search history.

(56) References Cited

U.S. PATENT DOCUMENTS 6,326,820 B1 * 12/2001 Fotouhi .......................... 327/108

* cited by examiner

*Primary Examiner* — Diana J Cheng
(74) *Attorney, Agent, or Firm* — Oblon, McClelland, Maier & Neustadt, L.L.P.

(57) ABSTRACT

Aspects of rail-to-rail line drivers using differential cascode bootstrapping are described. In one embodiment, a differential line driver includes first and second differential driver output legs. The first output leg includes a first p-type cascode stack and a first n-type cascode stack, and the second output leg includes a second p-type cascode stack and a second n-type cascode stack. The differential line driver also includes a differential cascode bootstrap circuit arrangement coupled to an output of the differential line driver. More particularly, the differential cascode bootstrap circuit arrangement is coupled between the first and second differential output driver legs and the output of the differential line driver. According to aspects of the embodiments described herein, differential line drivers with overvoltage protection and rail-to-rail output swings may be achieved. Further, the differential line drivers may be generally smaller, with cascode stack transistors of reduced in size.

20 Claims, 6 Drawing Sheets

RAIL-TO-RAIL LINE DRIVER USING DIFFERENTIAL CASCODE BOOTSTRAPING

CROSS-REFERENCE TO RELATED APPLICATIONS

This application claims the benefit of U.S. Provisional Application No. 61/906,107, filed Nov. 19, 2013, the entire contents of which is hereby incorporated herein by reference.

BACKGROUND

Differential communications rely upon two complementary or differential signals being communicated on a pair of conductors, often called a differential pair. As interference tends to impact both conductors to the same extent, and information is encoded according to the potential difference, for example, between the conductors, differential communications may improve resistance to electromagnetic noise and other factors of interference. Differential communications or signalling may be used for analog or digital signalling, such as in RS-422, RS-485, Ethernet, peripheral component interconnect (PCI) Express, DisplayPort, high definition multimedia interface (HDMI), and universal serial bus (USB) communications, for example.

BRIEF DESCRIPTION OF THE DRAWINGS

For a more complete understanding of the embodiments and the advantages thereof, reference is now made to the following description, in conjunction with the accompanying figures briefly described as follows.

Figure 1:
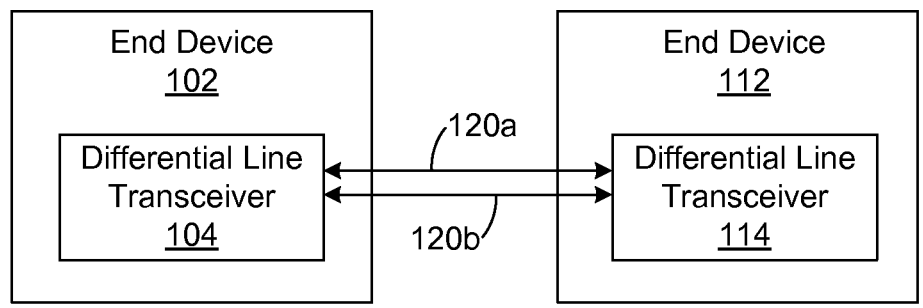
FIG. 1 illustrates a communications system using a differential communications link according to an example embodiment.

The drawings illustrate only example embodiments and are therefore not to be considered limiting of the scope described herein, as other consistent embodiments are with the scope and spirit of this disclosure. The elements and features shown in the drawings are not necessarily drawn to scale, emphasis instead being placed upon clearly illustrating the principles of the embodiments. Additionally, certain dimensions or positions of elements and features may be exaggerated to help visually convey certain principles. In the drawings, similar reference numerals between figures designate like or corresponding, but not necessarily the same, elements.

DETAILED DESCRIPTION

In the following paragraphs, various embodiments are described in further detail by way of example with reference to the attached drawings. In the description, well known components, methods, and/or processing techniques are omitted or briefly described so as not to obscure the embodiments.

As outlined above, differential communications rely upon two complementary or differential signals being communicated on a pair of conductors. In this context, a differential line driver may be relied upon to produce and/or drive the differential signals. In some cases, differential line drivers may be designed to operate over a range of modes or specifications of operation. For example, with regard to variants of Ethernet, it may be advantageous to design a differential line driver capable of signalling according to any of the 10BASE-T, 100BASE-T, or 1000BASE-T specifications, which vary in peak-to-peak differential voltage output swing, among other signalling aspects.

Generally, differential line drivers are designed to operate within certain operating parameters. For example, the transistors of a differential line driver are designed to operate within a certain voltage and current range, at a certain operating frequency, and at a certain temperature. Because the output of a differential line driver rapidly transitions between high and low voltages during data communications, differential line drivers must be designed to account for transient voltages and currents among transistors. The transient voltages and currents may lead to overvoltages across transistor junctions, for example, leading to reduced circuit lifetime and/or circuit failure. Especially as transistors are reduced in size, even smaller overvoltages may lead to circuit failures and should be accounted for in the design of differential line drivers.

In the context outlined above, aspects of rail-to-rail line drivers using differential cascode bootstrapping are described. In one embodiment, a differential line driver includes first and second differential driver output legs. The first output leg includes a first p-type cascode stack and a first n-type cascode stack, and the second output leg includes a second p-type cascode stack and a second n-type cascode stack. The differential line driver also includes a differential cascode bootstrap circuit arrangement coupled to an output of the differential line driver. More particularly, the differential cascode bootstrap circuit arrangement is coupled between the first and second differential output driver legs and the output of the differential line driver. According to aspects of the embodiments described herein, differential line drivers with overvoltage protection and rail-to-rail output swings may be achieved. Further, the differential line drivers may be generally smaller, with cascode stack transistors of reduced in size.

Turning now to the drawings, a description of exemplary embodiments of systems and system elements are provided, followed by a discussion of the operation of the same.

FIG. 1 illustrates a communications system 10 using a differential communications link according to an example embodiment. The system 10 includes an end device 102 in communication with an end device 112. In the system 10, the end devices 102 and 112 communicate with each other via a conductive medium including a differential pair of conductors 120a, 120b. The differential pair of conductors 120a, 120b may be embodied as, for example, one or more wires, cables, or any other type of medium capable of transmitting or conducting signals between the end devices 102 and 112. In various embodiments, the end devices 102 and 112 may communicate with each other using simplex or duplex modes of communication. To this end, both the end devices 102 and 112 may include circuitry that facilitates transmitting and receiving electrical signals and data via the differential pair of conductors 120a, 120b.

Among other circuitry, the end device 102 includes a differential line transceiver 104. Similarly, the end device 112 includes a differential line transceiver 114. Each of the transceivers 104 and 114 includes at least one differential line driver and differential line receiver, among other elements. It should be appreciated that the end devices 102 and 112 may include other elements (e.g., additional line drivers, processing circuitry, etc.), the discussion of which are omitted for the brevity. The differential line transceivers 104 and 114, generally, drive differential voltages over the differential pair of conductors 120a, 120b, to communicate data between the transceivers 104 and 114. The differential line transceiver 114 presents a transmission impedance to the differential line transceiver 104, and the differential line transceiver 104 presents a transmission impedance to the differential line transceiver 114.

Figure 2:
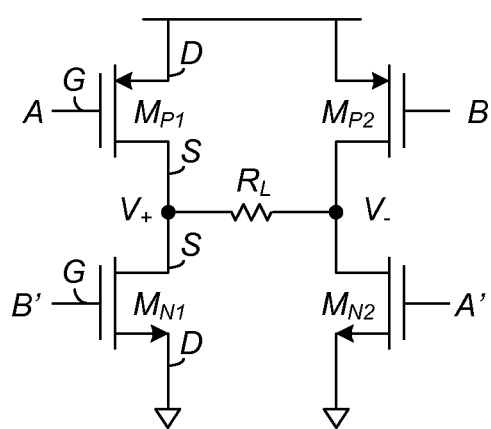
FIG. 2 illustrates a differential line driver according to an example embodiment.

FIG. 2 illustrates a differential line driver 20 according to an example embodiment. The differential line transceivers 104 and 114 in FIG. 1, for example, may include one or more line drivers similar to the differential line driver 20. The differential line driver 20 includes a first differential driver output leg and a second differential driver output leg. The first differential driver output leg includes the first p-type transistor $M_{P1}$ and the first n-type transistor $M_{N1}$, and the second differential driver output leg includes the second p-type transistor $M_{P2}$ and the second n-type transistor $M_{N2}$. A differential output from the differential line driver 20 may be taken across the $V_+$ and $V_-$ nodes, as illustrated in FIG. 2, where the circuit element $R_L$ represents a load driven by the differential line driver 20.

The transistors $M_{P1}$, $M_{N1}$, $M_{P2}$, and $M_{N2}$ may be embodied as metal oxide semiconductor field effect transistors (MOSFETs) or another type of transistor suitable for the application. The transistors $M_{P1}$, $M_{N1}$, $M_{P2}$, and $M_{N2}$ may be formed from a base of silicon, silicon and germanium, gallium arsenide, or another suitable semiconductor base material, without limitation. The sizes (e.g., length, width, etc.) of the transistors $M_{P1}$, $M_{N1}$, $M_{P2}$, and $M_{N2}$, respectively, may vary or be the same among embodiments. Each of the transistors $M_{P1}$, $M_{N1}$, $M_{P2}$, and $M_{N2}$ includes source, gate, drain and body terminals, as understood in the art, and illustrated for the transistors $M_{P1}$ and $M_{N1}$ in FIG. 2.

The output voltage of the differential line driver 20 (i.e., across the $V_+$-$V_-$ nodes) may be varied or transitioned from logic true to false voltage levels in accordance with the control signals (A, A') and (B, B'). As illustrated in FIG. 2, the control signals (A, A') are provided to the gate terminals of the transistors $M_{P1}$ and $M_{N2}$, and the control signals (B, B') are provided to the gate terminals of the transistors $M_{P2}$ and $M_{N1}$. Generally, the control signals (A, A') and (B, B') operate in a complimentary or class B nature to turn the transistors $M_{P1}$ and $M_{N2}$ on and the transistors $M_{P2}$ and $M_{N1}$ off, or to turn the transistors $M_{P2}$ and $M_{N1}$ on and the transistors $M_{P1}$ and $M_{N2}$ off.

Due to the relatively large output voltage swings delivered by line drivers over relatively long cables, and the relatively low over-voltage ratings for devices in advanced technologies, the transistors $M_{P1}$, $M_{N1}$, $M_{P2}$, and $M_{N2}$ may experience overvoltages. For example, when the control signals (A, A') and (B, B') operate to turn the transistors $M_{P1}$ and $M_{N2}$ on and the transistors $M_{P2}$ and $M_{N1}$ off, the transistors $M_{P2}$ and $M_{N1}$ experience a drain to source overvoltage condition. Similarly, when the control signals (A, A') and (B, B') operate to turn the transistors $M_{P2}$ and $M_{N1}$ on and the transistors $M_{P1}$ and $M_{N2}$ off, the transistors $M_{P1}$ and $M_{N2}$ experience a drain to source overvoltage condition. As described above, these overvoltage conditions place stress on the transistors $M_{P1}$, $M_{N1}$, $M_{P2}$, and $M_{N2}$ and may lead to circuit failure. As one approach to address overvoltage conditions, differential line drivers may be designed using cascode stacking, as described below.

Figure 3:
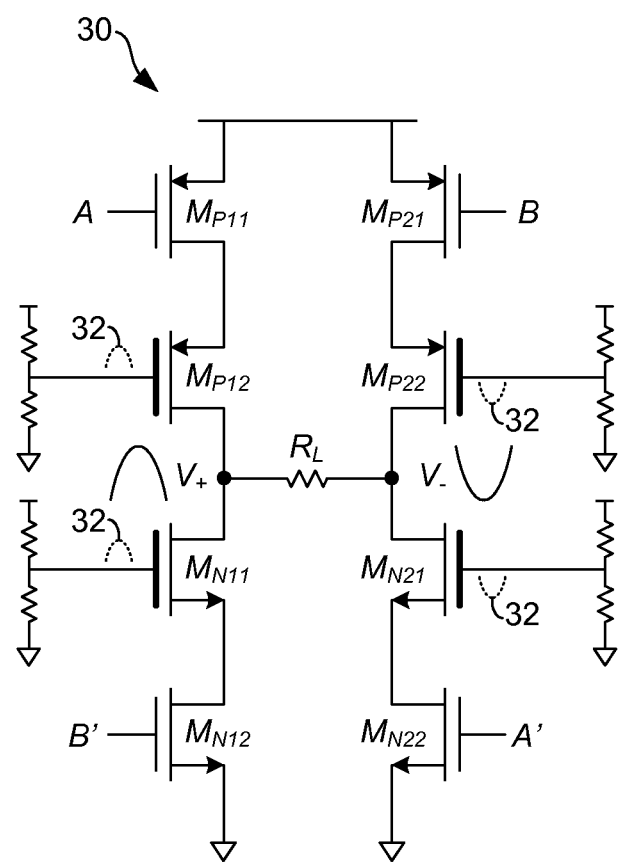
FIG. 3 illustrates a cascode differential line driver according to an example embodiment.

FIG. 3 illustrates a cascode stack differential line driver 30 according to an example embodiment. The differential line driver 30 includes a first differential driver output leg and a second differential driver output leg. The first differential driver output leg includes a first p-type cascode stack and a first n-type cascode stack, and the second differential driver output leg includes a second p-type cascode stack and a second n-type cascode stack.

The first p-type cascode stack comprises a first plurality of p-type transistors, including a first thin oxide (i.e., main) p-type transistor $M_{P11}$ and a first thick oxide (i.e., cascode) p-type transistor $M_{P12}$. The first n-type cascode stack comprises a first plurality of n-type transistors, including at least a first thick oxide (i.e., cascode) n-type transistor $M_{N11}$ and a first thin oxide (i.e., main) n-type transistor $M_{N12}$. The second p-type cascode stack comprises a second plurality of p-type transistors, including a second thin oxide (i.e., main) p-type transistor $M_{P21}$ and a second thick oxide (i.e., cascode) p-type transistor $M_{P22}$. The second n-type cascode stack comprises a first plurality of n-type transistors, including at least a second thick oxide (i.e., cascode) n-type transistor $M_{N21}$ and a second thin oxide (i.e., main) n-type transistor $M_{N22}$.

In one embodiment, as compared to the thin oxide transistors $M_{P12}$, $M_{P22}$, $M_{N11}$, and $M_{N21}$, the thick oxide transistors $M_{P12}$, $M_{P22}$, $M_{N11}$, and $M_{N21}$ each have a relatively thicker oxide layer between the gate and the device channel. Further, in some embodiments, as compared to the thin oxide transistors $M_{P12}$, $M_{P22}$, $M_{N11}$, and $M_{N21}$, the thick oxide transistors $M_{P12}$, $M_{P22}$, $M_{N11}$, and $M_{N21}$ may be relatively larger in device (e.g., channel) length and/or width.

Similar to the differential line driver 20 of FIG. 2, the output voltage of the differential line driver 30 (i.e., across the $V_+$-$V_-$ nodes) may be varied or transitioned from logic true to false voltage levels in accordance with the control signals (A, A') and (B, B'). As illustrated in FIG. 3, the control signals (A, A') are provided to the gate terminals of the transistors $M_{P11}$ and $M_{N22}$, and the control signals (B, B') are provided to the gate terminals of the transistors $M_{P21}$ and $M_{N12}$. A differential output from the differential line driver 30 may be taken across the $V_+$ and $V_-$ nodes, as illustrated in FIG. 3, where the circuit element $R_L$ represents a load driven by the differential line driver 30. In one embodiment, a static control voltage is applied to each of the thick oxide transistors $M_{P12}$, $M_{P22}$, $M_{N11}$, and $M_{N21}$.

At least to some extent, the thick oxide transistors $M_{P12}$, $M_{P22}$, $M_{N11}$, and $M_{N21}$ are relied upon in the differential line driver 30 to absorb overvoltage stress. For example, when transitioning between peak outputs, various transistors in the differential line driver 30 experience overvoltage conditions. For example, as compared to the overvoltage stress conditions in the differential line driver 20 of FIG. 2, overvoltages are shared or spread among the thin oxide transistors $M_{P11}$, $M_{P21}$, $M_{N12}$, and $M_{N22}$ and the thick oxide transistors $M_{P12}$, $M_{P22}$, $M_{N11}$, and $M_{N21}$ in the differential line driver 30 of FIG. 3. In this way, the transistors in the differential line driver 30 are better protected against overvoltage stress.

The addition of the thick oxide transistors $M_{P12}$, $M_{P22}$, $M_{N11}$, and $M_{N21}$ in the differential line driver 30 of FIG. 3, however, leads to a reduced output voltage swing for the line driver 30. In other words, for the same rail voltage, the differential line driver 20 of FIG. 2 is capable of larger output voltage swings as compared to the differential line driver 30, due to the additional voltage drop expended over the thick oxide transistors $M_{P12}$, $M_{P22}$, $M_{N11}$, and $M_{N21}$. It would be desirable to reduce any voltage drop expended over the thick oxide transistors $M_{P12}$, $M_{P22}$, $M_{N11}$, and $M_{N21}$, as the differential line driver 30 may be operated at relative low rail voltages and rail-to-rail output voltage swings may be necessary for multi-mode operations.

In an effort to reduce the voltage drop expended over the thick oxide transistors $M_{P12}$, $M_{P22}$, $M_{N11}$, and $M_{N21}$, the thick oxide transistors $M_{P12}$, $M_{P22}$, $M_{N11}$, and $M_{N21}$ may be formed relatively larger in size than the thin oxide transistors $M_{P11}$, $M_{P21}$, $M_{N12}$, and $M_{N22}$. The use of relatively large transistors $M_{P12}$, $M_{P22}$, $M_{N11}$, and $M_{N21}$, however, may lead to other undesirable operating conditions for the line driver 30. For example, larger transistor sizes are generally associated with larger parasitic capacitances.

The parasitic capacitances may lead to output-to-gate coupling 32 in the differential line driver 30. In turn, the coupling 32 may degrade the overvoltage protection provided by the thick oxide transistors $M_{P12}$, $M_{P22}$, $M_{N11}$, and $M_{N21}$ and/or push the main thin oxide transistors $M_{P11}$, $M_{P21}$, $M_{N12}$, and $M_{N22}$ into a linear range of operation, which is undesirable for a line driver. For example, due to the output-to-gate coupling 32, the main thin oxide transistors $M_{P11}$, $M_{P21}$, $M_{N12}$, and $M_{N22}$ may experience gate to source overvoltages when turned on and drain to source overvoltages when turned off. Further, the parasitic capacitances may lead to frequency-dependent operating variations and/or linearity disturbances. In an effort to reduce the output-to-gate coupling 32, other embodiments described herein include certain bootstrap circuit arrangements as described below.

Figure 4:
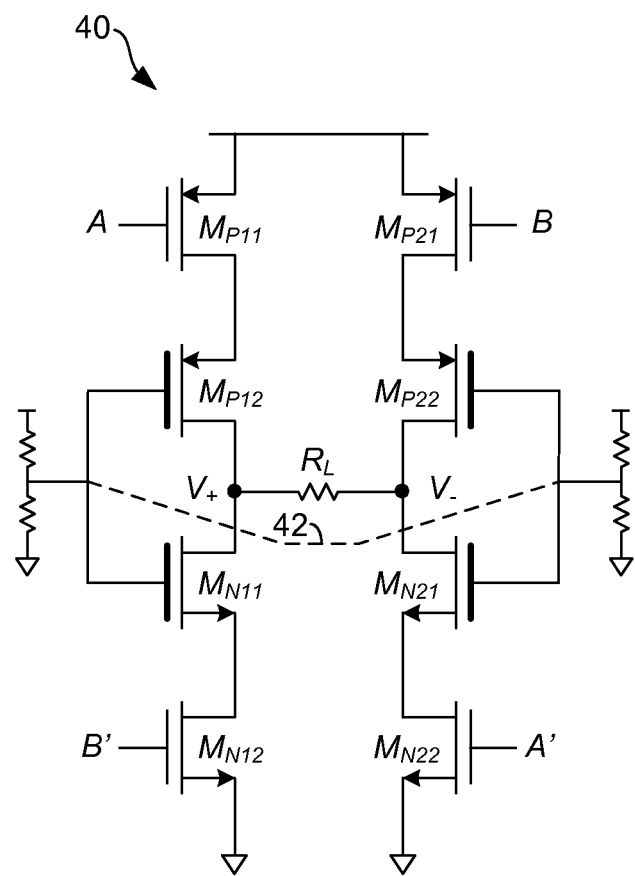
FIG. 4 illustrates a cascode differential line driver similar to the line driver of FIG. 3, with a shorted cascode bias according to an example embodiment.

FIG. 4 illustrates a cascode differential line driver 40 similar to the line driver of FIG. 3, with a shorted cascode bias according to an example embodiment. As compared to the cascode stack differential line driver 30 of FIG. 3, the differential line driver 40 includes a cascode bias short 42. The cascode bias short 42 may substantially cancel output-to-gate coupling in the differential line driver 40, by shorting the output-to-gate couplings between the transistors $M_{P12}$ and $M_{N11}$, and $M_{P22}$ and $M_{N21}$. This circuit arrangement, however, still suffers from the loss of headroom in the output voltage swing due to the voltage drop expended over the thick oxide transistors $M_{P12}$, $M_{P22}$, $M_{N11}$, and $M_{N21}$. Further, the relatively large parasitic capacitances of the thick oxide transistors $M_{P12}$, $M_{P22}$, $M_{N11}$, and $M_{N21}$ may still lead to frequency-dependent operating variations and/or linearity disturbances for the differential line driver 40.

Figure 5:
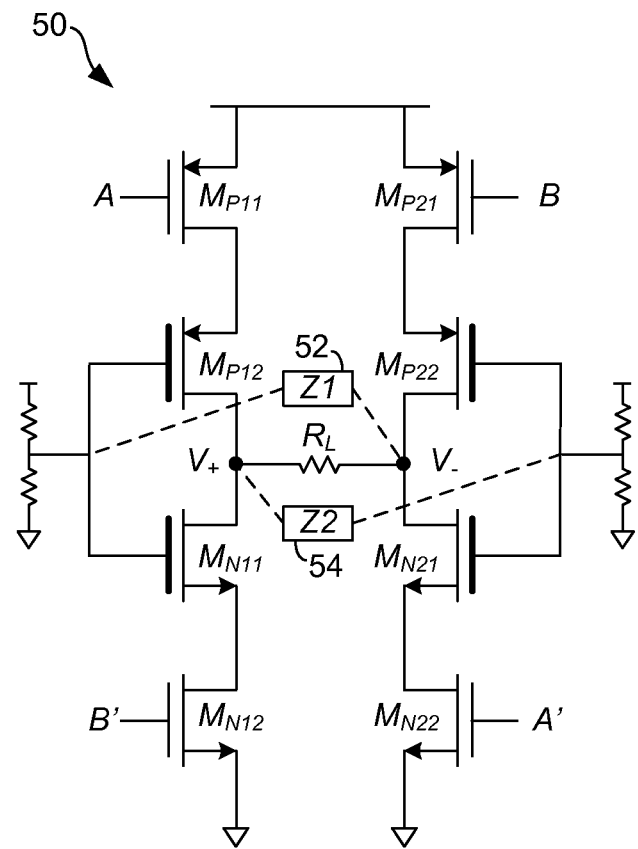
FIG. 5 illustrates a rail-to-rail differential line driver using differential cascode bootstrapping according to an example embodiment.

As compared to the differential line driver 40 of FIG. 4, FIG. 5 illustrates a rail-to-rail differential line driver 50 using differential cascode bootstrapping according to an example embodiment. In addition to the arrangement of the transistors in the cascode stack differential line driver 30, the rail-to-rail differential line driver 50 further includes a differential cascode bootstrap circuit arrangement 52, 54 coupled between the first and second differential output driver legs and the output (i.e., across the $V_+$-$V_-$ nodes) of the differential line driver 50. As illustrated in FIG. 5, the differential cascode bootstrap circuit arrangement 52, 54 includes a first impedance circuit path 52 and a second impedance circuit path 54.

More particularly, the differential line driver 50 includes a first differential driver output leg and a second differential driver output leg. The first differential driver output leg includes a first p-type cascode stack and a first n-type cascode stack, and the second differential driver output leg includes a second p-type cascode stack and a second n-type cascode stack.

The first p-type cascode stack comprises a first plurality of p-type transistors, including a first thin oxide p-type transistor $M_{P11}$ and a first thick oxide p-type transistor $M_{P12}$. The first n-type cascode stack comprises a first plurality of n-type transistors, including at least a first thick oxide n-type transistor $M_{N11}$ and a first thin oxide n-type transistor $M_{N12}$. The second p-type cascode stack comprises a second plurality of p-type transistors, including a second thin oxide p-type transistor $M_{P21}$ and a second thick oxide p-type transistor $M_{P22}$. The second n-type cascode stack comprises a first plurality of n-type transistors, including at least a second thick oxide n-type transistor $M_{N21}$ and a second thin oxide n-type transistor $M_{N22}$.

As illustrated in FIG. 5, the first impedance circuit path 52 is coupled between the gates of the first thick oxide p-type transistor $M_{P12}$ and the first thick oxide n-type transistor $M_{N11}$ and the inverting output (i.e., V) of the differential line driver 50. Further, the second impedance circuit path 54 is coupled between the gates of the second thick oxide p-type transistor $M_{P22}$ and the second thick oxide n-type transistor $M_{N21}$ and the non-inverting output (i.e., $V_+$) of the differential line driver 50. The first impedance circuit path 52 may include an arrangement of resistive, capacitive, and/or resistive and capacitive circuit elements (i.e., impedance Z1). Similarly, the second impedance circuit path 54 may include an arrangement of resistive, capacitive, and/or resistive and capacitive circuit elements (i.e., impedance Z2).

The differential cascode bootstrap circuit arrangement 52, 54 differentially cross couples outputs of the differential line driver 50 to gates of the cascode stack transistors $M_{P12}$, $M_{N11}$, $M_{P22}$, and $M_{N21}$. The cascode bootstrap circuit arrangement 52, 54 thus maximizes the gate-source voltage Vgs for the cascode stack transistors among $M_{P12}$, $M_{N11}$, $M_{P22}$, and $M_{N21}$ that are turned on. Because of the increased Vgs, the voltage drop Vds across the turned-on cascode stack transistors among $M_{P12}$, $M_{N11}$, $M_{P22}$, and $M_{N21}$ is lower (i.e., less rail-to-rail swing headroom loss). Thus, the differential line driver 50 may be able to provide rail-to-rail (or near rail-to-rail) output voltage swings.

In some embodiments of the differential line driver 50, the cascode stack transistors $M_{P12}$, $M_{N11}$, $M_{P22}$, and $M_{N21}$ may be reduced in size. That is, as compared to the differential line drivers 30 and 40, the cascode stack transistors $M_{P12}$, $M_{N11}$, $M_{P22}$, and $M_{N21}$ in the differential line driver 50 may be relatively smaller. In turn, the smaller transistor sizes tend to lower parasitic capacitances, less frequency-dependent operating variations, and less linearity disturbances. It is noted that, because of the high impedances of the gates of the cascode stack transistors $M_{P12}$, $M_{N11}$, $M_{P22}$, and $M_{N21}$, the additional loading at the output of the differential line driver 50 due to the cascode bootstrap circuit arrangement 52, 54 is substantially negligible.

Embodiments of the differential line drivers described herein may operate in a voltage or current mode of operation. When operating in voltage mode, when the differential line driver 50 sits in a high gain control loop (i.e., with the control loop which provides the control signals (A, A') and (B, B'), the output linearity of the differential line driver 50 is substantially unaffected by the addition of the differential cascode bootstrap circuit arrangement 52, 54. When operating in current mode, the impact of the differential cascode bootstrapping on the output linearity of the differential line driver 50 may be compensated by a current mirror, as described below.

Figure 6:
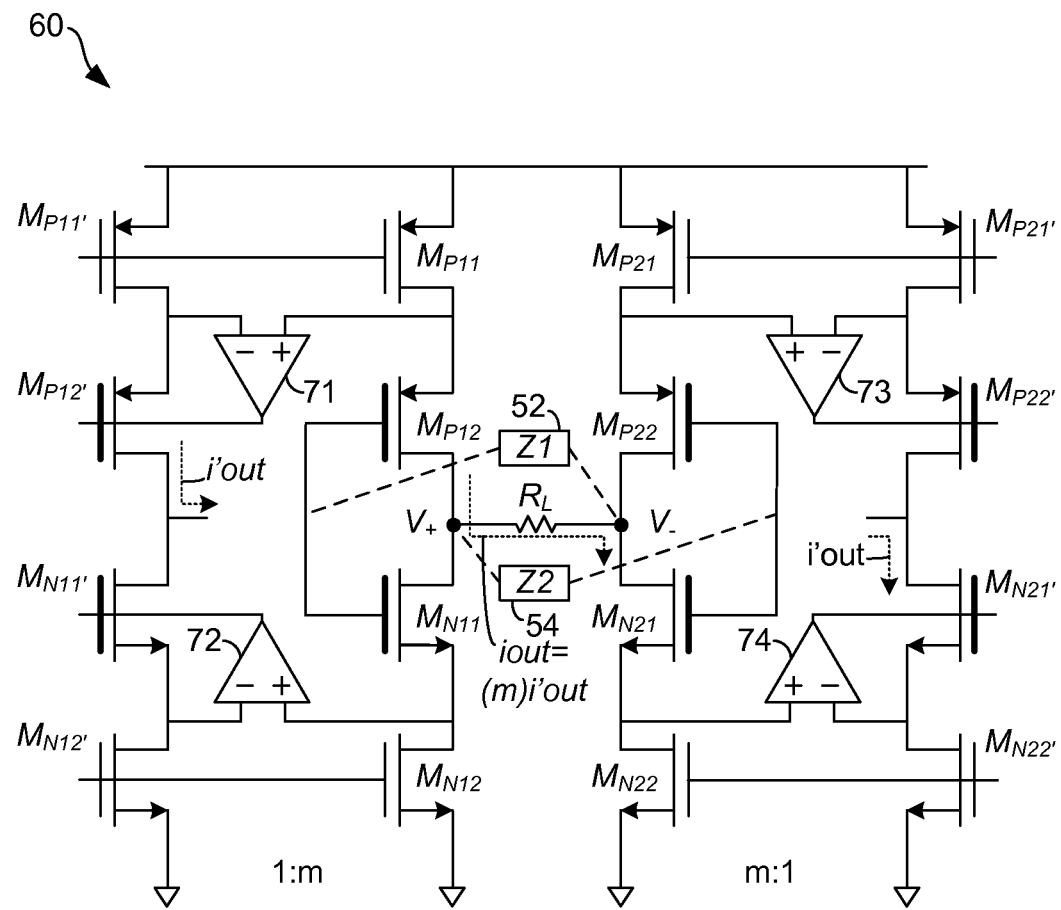
FIG. 6 illustrates a rail-to-rail differential line driver with current mirrors in a current mode of operation according to an example embodiment.

FIG. 6 illustrates a rail-to-rail differential line driver 60 with current mirrors in a current mode of operation according to an example embodiment. The differential line driver 60 is similar to the differential line driver 50 of FIG. 5. In one embodiment of the differential line driver 60, the impedances 52 and 54 may be embodied as capacitive impedances. The differential line driver 60 also includes a current mirror.

The current mirror of the differential line driver 60 includes a first current mirror leg and a second current mirror leg. The first current mirror leg includes a first p-type cascode mirror stack comprising the transistors $M_{P11'}$ and $M_{P12'}$ and a first n-type cascode mirror stack comprising the transistors $M_{N11'}$ and $M_{N12'}$. The second current mirror leg includes a second p-type cascode mirror stack comprising the transistors $M_{P21'}$ and $M_{P22'}$ and a second n-type cascode mirror stack comprising the transistors $M_{N21'}$ and $M_{N22'}$. The transistors in the current mirror (i.e., transistors $M_{P11'}$, $M_{P12'}$, $M_{N11'}$, $M_{N12'}$, $M_{P21'}$, $M_{P22'}$, $M_{N21'}$, and $M_{N22'}$) may be a scaled in size as compared to the transistors of the cascode stack differential line driver (i.e., transistors $M_{P11}$, $M_{P12}$, $M_{N11}$, $M_{N12}$, $M_{P21}$, $M_{P22}$, $M_{N21}$, and $M_{N22}$) by a factor of 1:m. Thus, the current output by the current mirror rout may be scaled factor of the current output iout by the cascode stack differential line driver.

As illustrated in FIG. 6, the gate of the transistor $M_{P11'}$ is coupled to the gate of the transistor $M_{P11}$, the gate of the transistor $M_{P21'}$ is coupled to the gate of the transistor $M_{P21}$, the gate of the transistor $M_{N12'}$ is coupled to the gate of the transistor $M_{N12}$, and the gate of the transistor $M_{N22'}$ is coupled to the gate of the transistor $M_{N22}$. The differential line driver 60 further includes a first difference amplifier 71, 72 coupled between the first differential driver output leg and the first current mirror leg, and a second difference amplifier 73, 74 coupled between the second differential driver output leg and the second current mirror leg.

As illustrated in FIG. 6, a non-inverting input of the difference amplifier 71 is coupled to the drain of the transistor $M_{P11}$, an inverting input of the difference amplifier 71 is coupled to the drain of the transistor $M_{P11'}$, and an output of the difference amplifier 71 is coupled to the gate of the transistor $M_{P12'}$. A non-inverting input of the difference amplifier 72 is coupled to the drain of the transistor $M_{N12}$, an inverting input of the difference amplifier 72 is coupled to the drain of the transistor $M_{N12'}$, and an output of the difference amplifier 72 is coupled to the gate of the transistor $M_{N11'}$. A non-inverting input of the difference amplifier 73 is coupled to the drain of the transistor $M_{P21}$, an inverting input of the difference amplifier 73 is coupled to the drain of the transistor $M_{P21'}$, and an output of the difference amplifier 73 is coupled to the gate of the transistor $M_{P22'}$. Further, a non-inverting input of the difference amplifier 74 is coupled to the drain of the transistor $M_{N22}$, an inverting input of the difference amplifier 74 is coupled to the drain of the transistor $M_{N22'}$, and an output of the difference amplifier 74 is coupled to the gate of the transistor $M_{N21'}$.

For current mode operations, the differential driver 60 is compensated by the local loop embodied in the current mirror. Using the difference amplifiers 71-74, the current mirror seeks to mirror the drain/source operating voltage differentials across the transistors $M_{P11'}$, $M_{P21'}$, $M_{N12'}$, and $M_{N22}$ to be the same as those across the transistors $M_{P11}$, $M_{P21}$, $M_{N12}$, and $M_{N22}$, respectively. In this manner, accurate current mirroring (e.g., iout=(m)i'out) may be achieved, based on control voltages at the gates of the transistors $M_{P12'}$, $M_{N11'}$, $M_{P22'}$, and $M_{N21'}$. Thus, the cascode modulation effect on the output linearity is compensated by the local loop provided by the current mirror.

According to aspects of the embodiments described herein, differential line drivers with overvoltage protection and rail-to-rail output swings may be achieved. Further, the differential line drivers may be generally smaller, as the cascode stack transistors may be reduced in size. Further, the parasitic capacitance generally associated with larger cascode stack transistors may be mitigated, and frequency-dependent operating variations and/or linearity disturbances may be mitigated.

In other aspects, a single line driver may be relied upon for multiple modes of operation, such as according to the 10BASE-T, 100BASE-T, and 1000BASE-T specifications. The same differential line driver used for simplex 10BASE-T communications may also be used for full-duplex 1000BASE-T communications, due to the elimination of bandwidth and linearity operating disturbances associated with large cascode stack transistor. Further, even for 2.5V rail voltage line driver devices, rail-to-rail output swings may be substantially achieved, mitigating the need for separate line drivers for the 10BASE-T, 100BASE-T, and 1000BASE-T specifications, which vary in peak-to-peak differential voltage output swing requirements. In this way, with the use of one line driver for multiple modes of operation, the costs of separate line drivers may be saved.

Figure 7:
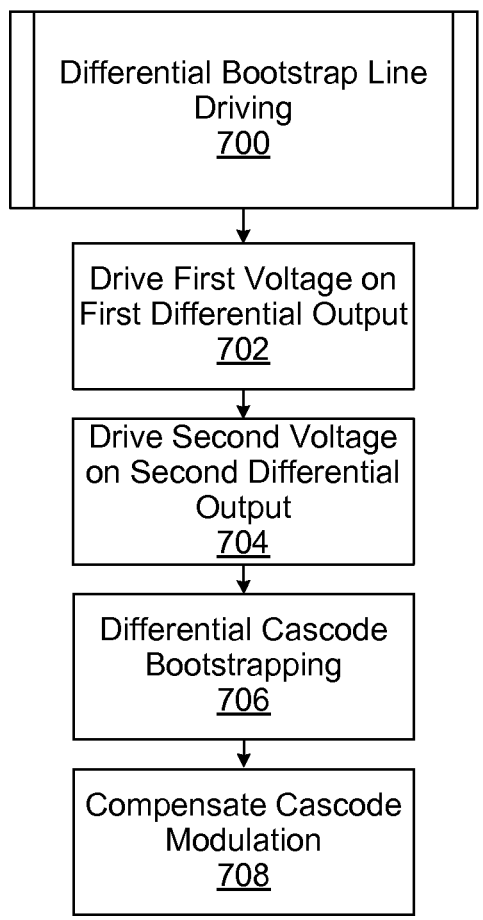
FIG. 7 illustrates an example process flow diagram of a process of differential bootstrap line driving performed by one or both of the line drivers of FIG. 5 or FIG. 6 according to an example embodiment.

Before turning to the process diagram of FIG. 7, it is noted that the processes described herein may be practiced in an order which is other than that illustrated. That is, the process flow illustrated in FIG. 7 is provided by way of example, and the embodiments may be practiced using a process flow that differs from that illustrated. Additionally, it is noted that one or more steps in the processes may be omitted or replaced. Further, steps may be performed in different orders, in parallel with one another, or omitted entirely, and/or certain additional steps may be performed without departing from the scope and spirit of the embodiments. Also, it is noted that, while the process of FIG. 7 is described in connection with line drivers 50 and/or 60 of FIGS. 5 and 6, the process may be performed in connection with other line drivers.

FIG. 7 illustrates an example process flow diagram of a process 700 of differential bootstrap line driving performed by one or both of the line drivers 50 and/or 60 of FIG. 5 and FIG. 6 according to an example embodiment. At reference numeral 702, the process 700 includes driving a first voltage on a first differential output node of a differential line driver. For example, with reference to the line drivers 50 and 60 of FIGS. 5 and 6, the line drivers 50 and 60 may drive a voltage to the first differential output node $V_+$. At reference numeral 704, the process 700 includes driving a second voltage on a second differential output node of the differential line driver. For example, with reference to the line drivers 50 and 60 of FIGS. 5 and 6, the line drivers 50 and 60 may drive a voltage to the second differential output node $V_-$. As described above, the voltages may be driven to the first and second differential output nodes based on the control signals (A, A') and (B, B').

At reference numeral 706, the process 700 includes differentially bootstrapping the first and second output nodes of the differential line driver to gate terminals of cascode transistors of the differential line driver. For example, with reference to the line drivers 50 and 60 of FIGS. 5 and 6, the differential output nodes $V_+$ and $V_-$ may be coupled via the impedances 52 and 54 to the gate terminals of the transistors $M_{P12}$, $M_{N11}$, $M_{P22}$, and $M_{N21}$, as illustrated in FIGS. 5 and 6 and described above.

At reference numeral 708, the process 700 includes compensating cascode modulation. In this context, the process 700 includes mirroring drain to source operating voltage differentials across transistors in the differential line driver to transistors of a local loop current mirror to compensate the linearity disturbance from the differential cascode bootstrapping. For example, with reference to FIG. 6, the cascode modulation on output linearity of the differential driver 60 is compensated by the local loop current mirror. Using the difference amplifiers 71-74, the current mirror in the differential amplifier 60 seeks to mirror the drain/source operating voltage differentials across the transistors $M_{P11'}$, $M_{P21'}$, $M_{N12'}$, and $M_{N22'}$ to be the same as those across the transistors $M_{P11}$, $M_{P21}$, $M_{N12}$, and $M_{N22}$, respectively.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

Therefore, at least the following is claimed:

1. A differential line driver, comprising:
   a first differential driver output leg comprising a first p-type cascode stack and a first n-type cascode stack;
   a second differential driver output leg comprising a second p-type cascode stack and a second n-type cascode stack; and
   a differential cascode bootstrap circuit arrangement coupled to an output of the differential line driver,
   wherein the cascode bootstrap circuit includes a first passive impedance circuit path and a second passive impedance circuit path.

2. The differential line driver according to claim 1, wherein the differential cascode bootstrap circuit arrangement is coupled between the first and second differential driver output legs and the output of the differential line driver.

3. The differential line driver according to claim 1, wherein:
   the first p-type cascode stack includes a first plurality of p-type transistors including at least a first thin oxide p-type transistor and a first thick oxide p-type transistor; and
   the first n-type cascode stack including a first plurality of n-type transistors including at least a first thin oxide n-type transistor and a first thick oxide n-type transistor.

4. The differential line driver according to claim 3, wherein the first passive impedance circuit path is coupled between gates of the first thick oxide p-type transistor and the first thick oxide n-type transistor and an output of the second differential driver output leg.

5. The differential line driver according to claim 1, wherein:
   the second p-type cascode stack including a second plurality of p-type transistors including at least a second thin oxide p-type transistor and a second thick oxide p-type transistor; and
   the second n-type cascode stack including a second plurality of n-type transistors including at least a second thin oxide n-type transistor and a second thick oxide n-type transistor.

6. The differential line driver according to claim 5, wherein the second passive impedance circuit path is coupled between gates of the second thick oxide p-type transistor and the second thick oxide n-type transistor and an output of the first differential driver output leg.

7. The differential line driver according to claim 1, further comprising:
   a first current mirror leg including a first p-type cascode mirror stack and a first n-type cascode mirror stack; and
   a second current mirror leg including a second p-type cascode mirror stack and a second n-type cascode mirror stack.

8. The differential line driver according to claim 7, further comprising:
   a first difference amplifier coupled between the first differential driver output leg and the first current mirror leg; and
   a second difference amplifier coupled between the second differential driver output leg and the second current mirror leg.

9. The differential line driver according to claim 1, wherein both the first and the second passive impedance circuit paths include at least one of a resistive element and a capacitive element.

10. A differential line driver, comprising:
    a first differential driver output leg comprising a first cascode stack;
    a second differential driver output leg comprising a second cascode stack; and
    a differential cascode bootstrap circuit coupled between the first and second differential output driver legs and the output of the differential line driver, the differential cascode bootstrap circuit including a first passive impedance circuit path and a second passive impedance circuit path.

11. The differential line driver according to claim 10, wherein:
    the first differential driver output leg includes a first p-type cascode stack and a first n-type cascode stack; and
    the second differential driver output leg includes a second p-type cascode stack and a second n-type cascode stack.

12. The differential line driver according to claim 11, wherein:
    the first p-type cascode stack includes a first plurality of p-type transistors including at least a first thin oxide p-type transistor and a first thick oxide p-type transistor; and
    the first n-type cascode stack includes a first plurality of n-type transistors including at least a first thin oxide n-type transistor and a first thick oxide n-type transistor.

13. The differential line driver according to the claim 12, wherein the first passive impedance circuit path is coupled between gates of the first thick oxide p-type transistor and the first thick oxide n-type transistor and an output of the second differential driver output leg.

14. The differential line driver according to the claim 11, wherein:
    the second p-type cascode stack includes a second plurality of p-type transistors including at least a second thin oxide p-type transistor and a second thick oxide p-type transistor; and
    the second n-type cascode stack includes a second plurality of n-type transistors including at least a second thin oxide n-type transistor and a second thick oxide n-type transistor.

15. The differential line driver according to the claim 14, wherein the second passive impedance circuit path is coupled between gates of the second thick oxide p-type transistor and the second thick oxide n-type transistor and an output of the first differential driver output leg.

16. The differential line driver according to the claim 10, further comprising:
    a first current mirror leg including a first p-type cascode mirror stack and a first n-type cascode mirror stack; and
    a second current mirror leg including a second p-type cascode mirror stack and a second n-type cascode mirror stack.

17. The differential line driver according to the claim 16, further comprising:

a first difference amplifier coupled between the first differential driver output leg and the first current mirror leg; and a second difference amplifier coupled between the second differential driver output leg and the second current mirror leg.

18. A differential driving method, comprising:
driving a first voltage on a first differential output node of a differential line driver;
driving a second voltage on a second differential output node of the differential line driver; and
differentially bootstrapping the first and second differential output nodes of the differential line driver to gate terminals of cascode transistors of a differential cascode bootstrap circuit of the differential line driver, the difference cascode bootstrap circuit including a first passive impedance circuit path and a second passive impedance circuit path.

19. The differential driving method according to claim 18, further comprising mirroring drain to source operating voltage differentials across transistors in the differential line driver to transistors of a local loop current mirror.

20. The differential driving method according to claim 18, wherein the differentially bootstrap includes differential line driver comprises:
differentially bootstrap an output of a first differential driver output leg comprising a first p-type cascode stack and a first n-type cascode stack, the output of the first differential driver output leg corresponding to the first output node; and
differentially bootstrapping an output of a second differential driver output leg comprising a second p-type cascode stack and a second n-type cascode stack, the output of the second differential driver output leg corresponding to the second output node.

* * * * *